United States Patent [19]
van der Heijden

[11] Patent Number: 5,477,367
[45] Date of Patent: Dec. 19, 1995

[54] OPTICAL TRANSMISSION SYSTEM

[75] Inventor: Alfons A. B. van der Heijden, Eindhoven, Netherlands

[73] Assignee: U.S. Philips Corporation, New York, N.Y.

[21] Appl. No.: 157,773

[22] Filed: Nov. 24, 1993

[30] Foreign Application Priority Data

Dec. 4, 1992 [EP] European Pat. Off. .............. 92203766

[51] Int. Cl.$^6$ .................................................. H04B 10/04
[52] U.S. Cl. ..................... 359/180; 359/161; 359/188; 372/38
[58] Field of Search ..................................... 359/111, 125, 359/161, 173, 180, 182, 187, 188, 195; 372/38; 307/311

[56] References Cited

U.S. PATENT DOCUMENTS

| 4,959,820 | 8/1990 | Frisch ........................................ 307/311 |
| 5,282,072 | 1/1994 | Nazarathy et al. ...................... 359/157 |

FOREIGN PATENT DOCUMENTS

| 0269048 | 6/1989 | Germany ................................ 359/180 |
| 59-036446 | 2/1984 | Japan. | |
| 0036446 | 2/1984 | Japan ..................................... 359/180 |
| 9212555 | 7/1992 | WIPO. | |

OTHER PUBLICATIONS

"Comparison of Direct and External Modulation For CATV Lightwave Transmission at 1.5 um Wavelength" in Electronics Letters, 24, Sep. 1992, vol. 28 No. 20, pp. 1875–1876.

Primary Examiner—Leo H. Boudreau
Assistant Examiner—Kinfe-Michael Negash
Attorney, Agent, or Firm—Leroy Eason

[57] ABSTRACT

To compensate for the non-linear conversion characteristic of the laser diode of an optical transmitter, a linearization circuit is provided which includes the combination of a first circuit including a zener diode and a second circuit including an impedance element. The zener diode is biased to provide a non-linear operating impedance such that the impedance of the combination varies substantially inversely to variations of the non-linear conversion characteristic of the laser diode at different signal levels.

6 Claims, 3 Drawing Sheets

OPTICAL TRANSMISSION SYSTEM

BACKGROUND OF THE INVENTION

The invention relates to an optical transmission system comprising an optical transmitter coupled via a glass fibre to at least an optical receiver, the optical transmitter comprising an electro-optical converter and linearization means for linearizing the relation between an electric input signal of the electro-optical converter and a parameter of an optical output signal of the electro-optical converter. The invention likewise relates to an optical transmitter to be used in such a transmission system.

A transmission system as defined in the opening paragraph is known from the journal article "Comparison of direct and external modulation for CATV Lightwave transmission at 1.5 µm wavelength" in Electronics Letters 24, September 1992, Vol. 28, No. 20 pp. 1875–1876.

In the known transmission system an electrical input signal is applied to an electro-optical converter which converts the input signal into changes of a parameter of the light emitted by the electro-optical converter. This parameter may be, for example, the intensity (power), frequency, phase or a combination of these parameters. The electro-optical converter may comprise, for example, a laser or LED directly controlled by the input signal. Alternatively, it is conceivable that the electro-optical converter comprises a laser or LED which continously generates a light signal that is modulated by an external modulator which is controlled by the input signal.

For example, the input signal may be a signal in one of a combination of a large number of TV channels transmitted in the frequency-division multiplex mode, such as is customary in cable television systems. When such signals are transmitted, very strict requirements are made on the linearity of the relation between the input signal and the corresponding parameter of the optical output signal of the electro-optical converter. This is essential, because intermodulation in the transmission system may occur as a result of non-linearity, so that an (undesired) mixing product of two TV channels may cause an interference signal to occur in a third TV channel.

In the known transmission system linearization means to improve this linearity are used which effect a predistortion of the input signal that is the reverse of the distortion occurring in the electro-optical converter. As a result, a more linear relation between input signal and the corresponding parameter of the optical output signal of the electro-optical converter is obtained. The linearization means in the known transmission system are rather complex, however, due to the presence of a power divider, a predistortion circuit, a controllable delay and a power combiner.

SUMMARY OF THE INVENTION

It is an object of the invention to provide a transmission system as defined in the opening paragraph, in which the complexity of the linearization means is reduced considerably. For this purpose, the invention is characterized in that the electro-optical converter is connected in series with the linearization means and in that the linearization means comprise a parallel combination of a first circuit that comprises a diode and a second circuit that comprises an impedance element.

An alternative embodiment of the invention is characterized in that the linearization means are connected in parallel with the electro-optical converter and in that the linearization means comprise a series combination of a first circuit that comprises a diode and a second circuit that comprises an impedance element.

The combination of the impedance element and the diode generates a predistortion signal which, with a right choice of the value of the impedance element, has equal size and opposite phase to the distortion introduced by the electro-optical converter, so that the combination presents improved linearity. Since the linearization means comprise only a few elements included in the control circuit of the electro-optical converter, a compact and simple realisation of the transmission system is achieved. This compactness has the additional advantage that the transmission system will be suitable for relatively high frequencies.

It is observed that from U.S. Pat. No. 4,952,820, issued Aug. 28, 1990, an optical transmitter is known which comprises a series combination of a diode and an electro-optical converter. However, that combination does not comprise an impedance element as is present in this invention for setting the predistortion to a desired value, so that the predistortion will not have the right value.

A further embodiment of the invention is characterized in that the diode comprises a Schottky diode.

Since Schottky diodes present an excellent high frequency behaviour, the use of a Schottky diode in this invention results in an eminent high frequency behaviour of the transmission system. However, it is alternatively conceivable to use in the invention other types of diodes having good high frequency properties.

BRIEF DESCRIPTION OF THE DRAWING

The invention will now be further explained with reference to the drawing Figures, in which.

DETAILED DESCRIPTION OF THE PREFERRED EMBODIMENTS

Figure 1:
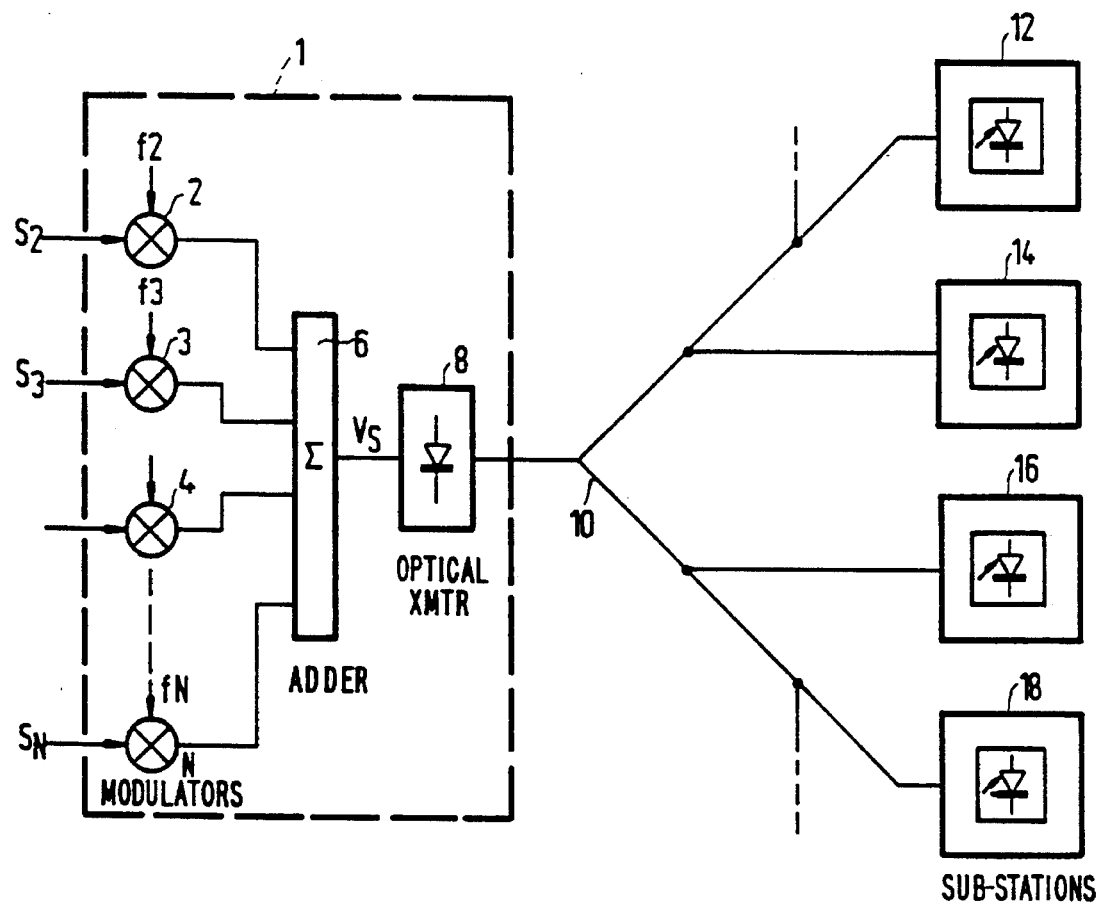
FIG. 1 shows a transmission system in which the invention is used.

In the transmission system shown in FIG. 1 each first input of modulators 2 to N is supplied with a corresponding transmit signal $S_2$ to $S_N$. A second input of each modulator 2 to N is supplied with a carrier signal having a frequency $f_2$ to $f_N$. The modulated outputs of the modulators 2 to N are connected to inputs of an adder circuit 6. The output of the adder circuit 6 is connected to an input of an optical transmitter 8. A signal $V_S$ is the input signal of the optical transmitter 8. The optical transmitter 8 is connected to a plurality of sub-stations 12 to 18 via a glass fibre network 10.

The signals $S_2$ to $S_N$ may be, for example, video signals such as used in cable television distribution, or data signals. The modulators 2 to N modulate each signal $S_2$ to $S_N$ on its own carrier. This modulation may be performed by known modulation techniques such as various forms of amplitude modulation (for example, AM, VSB, SSB, ASK) or various forms of angle modulation (for example, FM, PM, FSK, PSK). By adding the output signals of the modulators 2 to N together, a frequency-multiplexed signal $V_S$ is obtained. The optical transmitter 8 converts this signal to a light signal of which a parameter, for example, wavelength, or intensity, is modulated in dependence on the signal $V_S$.

This light signal is distributed to the sub-stations 12 to 18 via the glass fibre network 10. In each of the sub-stations 12 to 18 there is an optical receiver which converts the received light signal to a replica of the frequency-multiplexed signal $V_S$. This replica may further be processed by known means to a suitable signal for a terminal station such as, for example, a television set, a telephone set or a personal computer.

If the optical transmitter presents a non-linear relationship between the input signal and the modulated parameter of the generated light signal, intermodulation may occur. For example, assure that two transmit signals are modulated on carriers having frequencies $f_2$ and $f_3$, and then combined in an optical transmitter 8 which presents second-order distortion in the modulated parameter of the light signal. There will then be intermodulation components having frequencies $f_2+f_3$ and $|f_2-f_3|$ in the output signal of the optical receivers in addition to components having frequencies $f_2$ and $f_3$. If one of the other transmit signals is modulated on a carrier having one of the frequencies $f_2+f_3$ or $|f_2-f_3|$, the reception of these transmit signals will be disturbed by the intermodulation signals. In order to keep this disturbance within justifiable limits, strict requirements must be imposed on the linearity of the optical transmitter.

Figure 2:
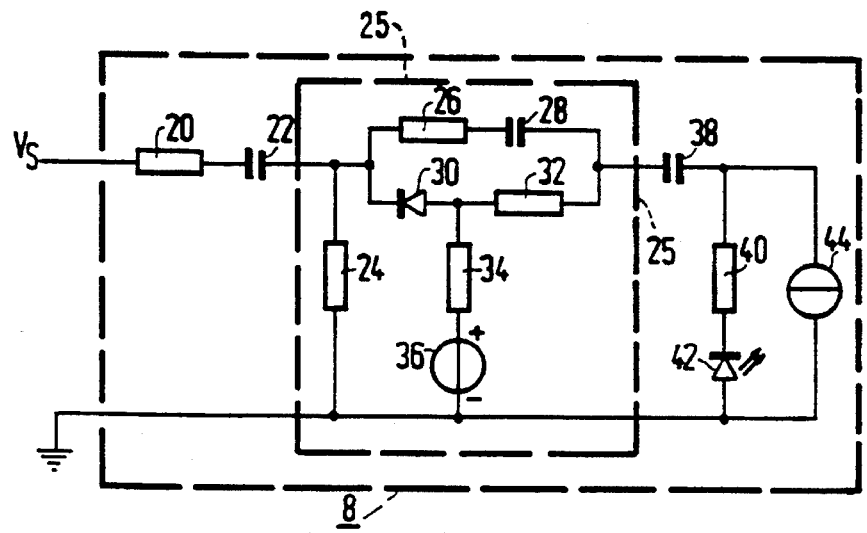
FIG. 2 shows a first embodiment for the optical transmitter 1 shown in FIG. 1.

In the optical transmitter 8 as shown in FIG. 2 the input signal is applied to a first terminal of a resistor 20. A second terminal of the resistor 20 is connected to a first terminal of a capacitor 22. A second terminal of the capacitor 22 is connected to an input terminal of the linearization means 25.

In the linearization means its input terminal is connected to a first terminal of an impedance element according to the inventive idea, in this case being a resistor 26. The input terminal of the linearization means 25 is also connected to the cathode of a Schottky diode 30 and to a first terminal of a resistor 24. The Schottky diode 30 here forms the diode according to the inventive idea. A second terminal of the resistor 26 is connected to a first terminal of a capacitor 28. The anode of the Schottky diode 30 is connected to a first terminal of a resistor 34 and to a first terminal of a resistor 32. A second terminal of the resistor 34 is connected to a positive terminal of a DC voltage source 36. A second terminal of the resistor 24 and a negative terminal of the DC voltage source 36 are connected to a point of reference potential further to be denoted earth. A second terminal of the capacitor 28 and a second terminal of the resistor 32 are connected to the output of the linearization means 25. The first circuit here comprises the series combination of the diode 30 and the resistor 32, whereas the second circuit comprises the series combination of the resistor 26 and the capacitor 28.

The output of the linearization means is connected to a first terminal of a capacitor 38. A second terminal of the capacitor 38 is connected to a first terminal of a resistor 40 and to a first terminal of a DC current source 44. A second terminal of the resistor 40 is connected to a first terminal of the electro-optical converter, in this case being a solid-state laser 42. A second terminal of the solid-state laser 42 and a second terminal of the current source 44 are connected to earth.

The diode 30 is set to a quiescent current by the voltage source 36 and the resistors 34 and 24. This quiescent current is selected so that the relation between voltage and current of the diode 30 is, in essence, quadratic. The capacitors 22, 28 and 38 are present to prevent DC current from flowing through the diode via a route other than via the voltage source 36 and the resistors 24 and 34. The current source 44 is present to supply quiescent current to the solid-state laser 42. The capacitor 38 is present to limit the current flowing through the solid-state laser 42, whereas the resistor 32 is present to equalize the input impedance of the optical transmitter 8 and an output impedance of the signal voltage source. The degree of predistortion can be set by means of the resistor 32.

In explanation of the linearizing effect of the invention it is assumed that the input voltage of the optical transmitter 8 rises. This rise will also cause the voltage between the input terminals of the linearization means 25 to rise likewise. Since the diode 30 is biased in a direction opposite to that of the voltage change across the linearization means, the net voltage across the diode 30 will drop. As a result, the impedance of the diode 30 will increase, so that the overall impedance of the linearization means 25 will increase likewise. The result of this is that the voltage across the linearization means will rise more than proportionally, and consequently the voltage across the solid-state laser 42 will rise less than proportionally. Such a compensation is suitable for compensating the non-linearity of a what is commonly referred to as a superlinear solid-state laser 42, the associated parameter of the emitted light increasing more than proportionally with the signal supplied to this laser.

To compensate a sub-linear solid-state laser, wherein the associated parameter of the transmitted light increases less than proportionally to the signal supplied to this laser, the terminals of the diode 30 are to be exchanged and also the polarity of the DC voltage source 36 is to be sign inverted. These measures lead to the fact that in the case of a rising input voltage of the optical transmitter 8 the impedance of the diode 30 decreases so that the voltage across the linearization means 25 rises less than proportionally. As a result, the voltage across the combination of the solid-state laser 42 and resistor 40 rises more than proportionally, so that a sub-linear transfer characteristic of the solid-state laser 42 can indeed be compensated.

Figure 3:
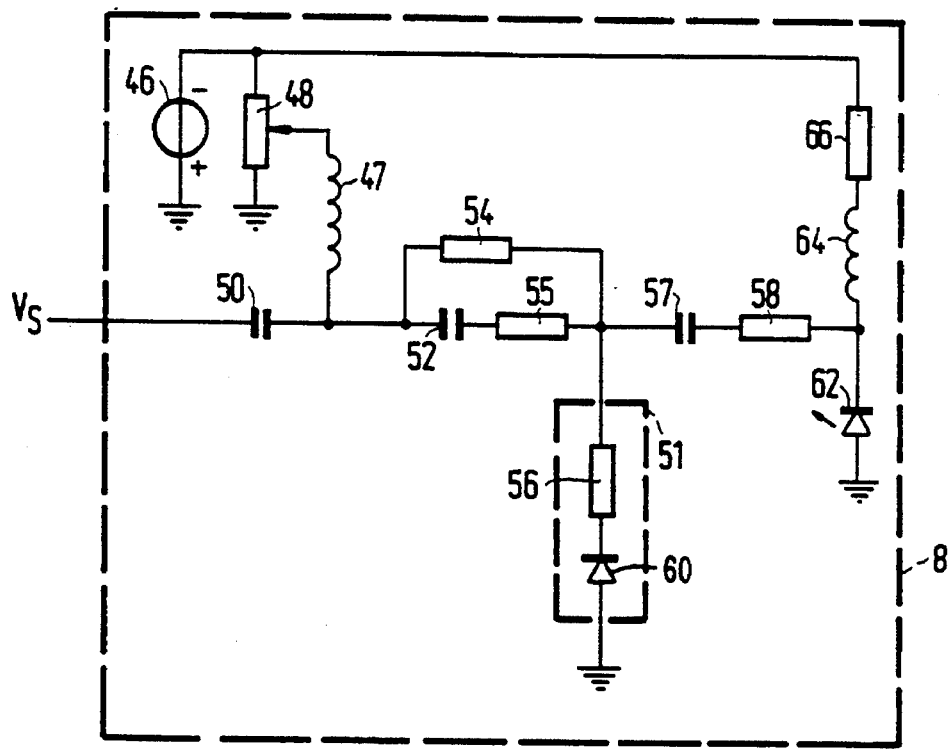
FIG. 3 shows a second embodiment for the optical transmitter 1 shown in FIG. 1.

In the optical transmitter 8 as shown in FIG. 3 a positive terminal of a DC voltage source 46 is connected to earth. A negative terminal of the voltage source 46 is connected to a first fixed terminal of an adjustable voltage divider 48, and to a first terminal of resistor 66. A second fixed terminal of the voltage divider 48 is connected to earth. An adjustable terminal of the adjustable voltage divider 48 is connected via a self-inductance 47 to a first terminal of a resistor 54, a first terminal of a capacitor 50 and to a first terminal of a capacitor 52. A second terminal of the capacitor 50 forms the input to the optical transmitter to which the signal $V_S$ is applied.

A second terminal of the capacitor 52 is connected to a first terminal of a resistor 55. A second terminal of the resistor 55 is connected to a second terminal of the resistor 54, to a first terminal of a capacitor 57 and to a first terminal of the linearization means 51. A second terminal of the linearization means is connected to earth. The linearization means 51 comprise in this case a series combination of a Schottky diode 60 and an impedance element in this case being a resistor 56. The first circuit comprises here the Schottky diode 60, whereas the second circuit comprises the resistor 56.

A second terminal of the capacitor 57 is connected to a first terminal of a resistor 58. A second terminal of the resistor 58 is connected to a fixed terminal of the electro-optical converter, in this case being the cathode of a solid-state laser 62. The second terminal of the resistor 58 is furthermore connected to a first terminal of a self-inductance 64 whose second terminal is connected to a second terminal of the resistor 66. The anode of the solid-state laser 62 is connected to earth.

The DC voltage source 46 is present to generate a quiescent current for the solid-state laser 62 and for the Schottky diode 60. The quiescent current for the solid-state laser 62 is supplied via the resistor 66 and the self-inductance 64, whereas the quiescent current for the Schottky diode 60 is supplied via the adjustable voltage divider 48 and the resistors 54 and 56. The capacitors 50 and 52 provide that the quiescent current of the Schottky diode 60 cannot flow through the voltage source $V_S$ (not shown) or the resistor 55. The self-inductance 64 provides that the signal current coming from the voltage source $V_S$ cannot flow away through the resistor 66 and voltage source 46. The self-inductance 47 provides that the signal source $V_S$ is not short-circuited via the adjustable voltage divider 48.

The resistor 55 together with the output impedance of the voltage source $V_S$ as required, supplies a current to the parallel combination of linearization means 51 and the combination of solid-state laser 62 and resistor 58. The degree of predistortion can be set with the resistor 56.

If the current I flowing through resistor 55 rises, so will the current flowing through the solid-state laser 62 and through the linearization means. The rising current will cause the impedance of the linearization means to decrease, so that the current flowing through the linearization means will rise more than proportionally. As a result, the current flowing through the solid-state laser 62 will rise less than proportionally, so that a superlinear behaviour of the solid-state laser 62 can be compensated. The degree of compensation can be set by means of the adjustable voltage divider and by means of the resistor 56.

Figure 4:
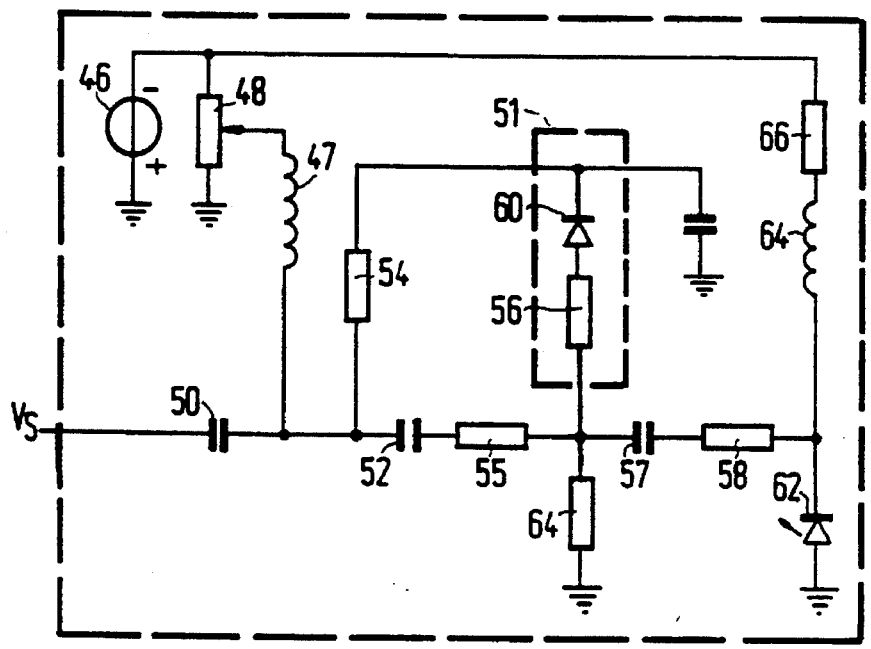
FIG. 4 shows a third embodiment for the optical transmitter shown in FIG. 1.

The optical transmitter as shown in FIG. 4 is derived from the optical transmitter shown in FIG. 3 in that the linearization means 51 are substituted by a resistor 64 and the linearization means 51 are inserted between the junction of resistor 55 and capacitor 57 and the first terminal of the resistor 54. In addition, a capacitor 67 is inserted between the first terminal of the resistor 54 and earth. The result of these modifications is that the linearization means for signal voltages are still connected in parallel with the combination of solid-state laser 62 and the resistor 58, but that the polarity of the quiescent current is sign inverted.

If the current I flowing through resistor 55 rises, the current flowing through the Schottky diode 60 will fall, so that the impedance of the linearization means will increase. Due to the increased impedance of the linearization means, which is connected in parallel with the combination of the solid-state laser 62 and resistor 58, a relatively larger part of the current I will flow through the solid-state laser 62, so that this current will rise more than proportionally. As a result, the circuit as shown in FIG. 4 is suitable for linearizing a solid-state laser 62 which has a sub-linear behaviour.

Figure 5A:
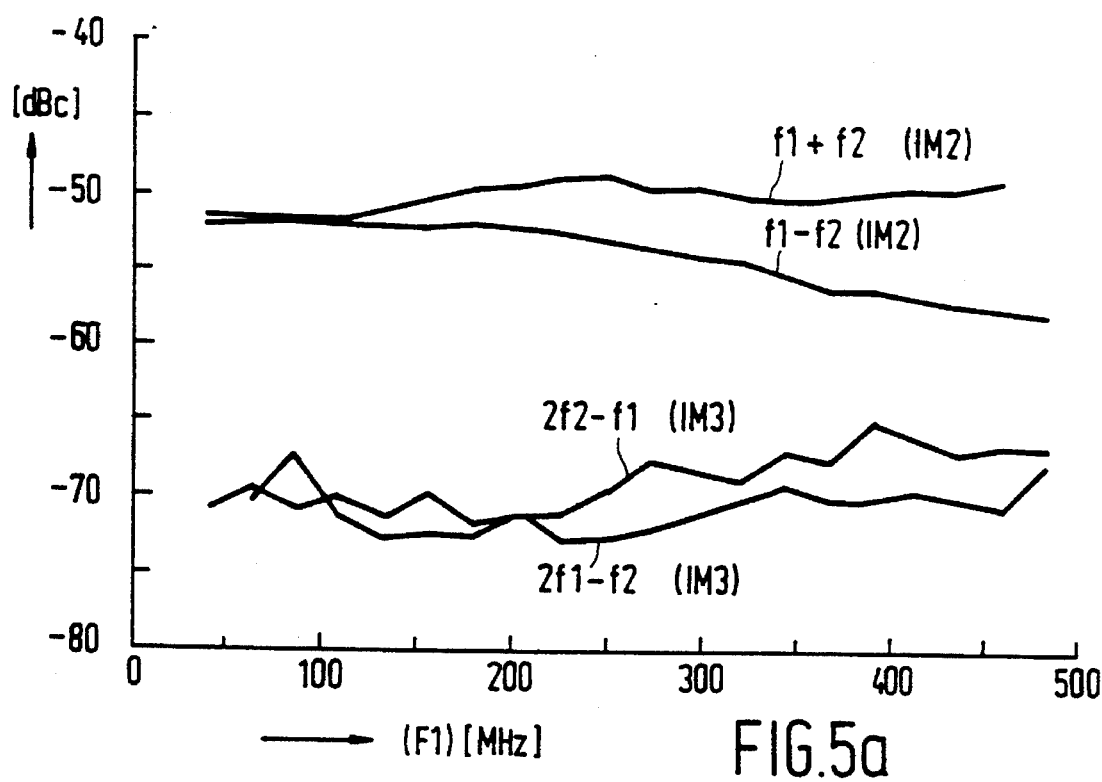
FIG. 5a shows measured values of intermodulation in a transmission system without linearization means.

FIG. 5a shows measured values of second and third-order intermodulation products for a laser without linearization means. The measurement was carried out by supplying to the laser the sum of two carriers having a constant frequency difference of 47 MHz and applying the two carriers, amplitude modulated, with a modulation depth of 35%. In FIG. 5a the relative amplitudes of the second and third-order intermodulation products are plotted against frequency of either carrier. FIG. 5a clearly shows that the second-order distortion is dominant.

Figure 5B:
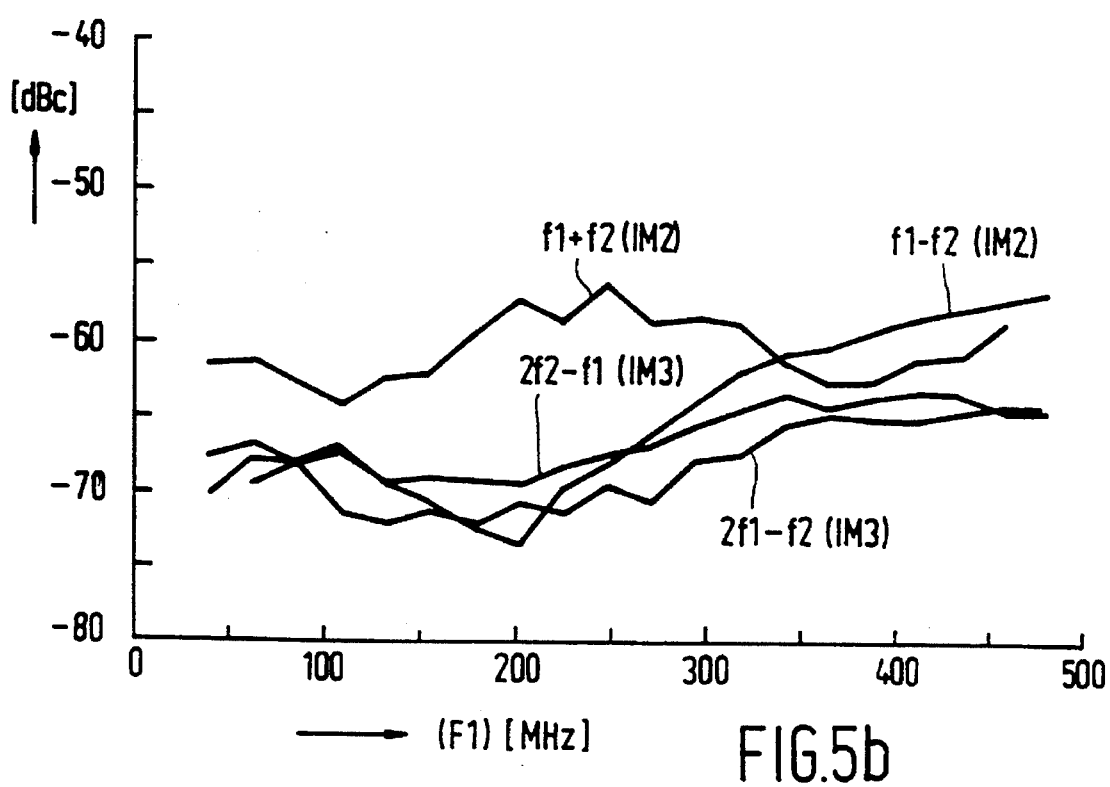
FIG. 5b shows measured values of intermodulation in a transmission system according to the invention.

In FIG. 5b the result of the same measurement is plotted in which the current flowing through the linearization means was selected to be so large that no appreciable third-order intermodulation was caused by the linearization means, but that the second-order intermodulation of the solid-state laser 62 was compensated. FIG. 5b distinctly shows that the second-order intermodulation has decreased by about 10 dB.

I claim:

1. An optical transmitter for use in an optical transmission system wherein an optical signal produced by said transmitter is coupled by an optical fiber to at least one optical receiver; said transmitter comprising:

an electro-optical converter for receiving an electrical input signal and producing an optical output signal having a parameter which is related to said electrical input signal in accordance with a conversion characteristic of said converter; and linearization means connected in series with said converter for linearizing said conversion characteristic, said linearization means comprising
a parallel combination of a first circuit comprising a diode and a second circuit comprising an impedance element; and
biasing means connected to said first circuit for biasing said diode so as to provide a non-linear operating impedance such that said parallel combination subjects said input signal to non-linear predistortion substantially equal but opposite to distortion thereof caused by non-linearity of the conversion characteristic of said converter.

2. An optical transmitter as claimed in claim 1, wherein said diode comprises a Schottky diode.

3. An optical transmitter as claimed in claim 1, wherein the non-linear operating impedance of said diode corresponds to a substantially quadratic voltage vs current relationship.

4. An optical transmitter for use in an optical transmission system wherein an optical signal produced by said transmitter is coupled by an optical fiber to at least one optical receiver; said transmitter comprising:

an electro-optical converter for receiving an electrical input signal and producing an optical output signal having a parameter which is related to said electrical input signal in accordance with a conversion characteristic of said converter; and linearization means connected in series with said converter for linearizing said conversion characteristic, said linearization means comprising
a series combination of a first circuit comprising a diode and a second circuit comprising an impedance element; and
biasing means connected to said first circuit for biasing said diode so as to provide a non-linear operating impedance such that said series combination subjects said input signal to predistortion substantially equal but opposite to non-linear distortion thereof caused by non-linearity of the conversion characteristic of said converter.

5. An optical transmitter as claimed in claim 4, wherein said diode comprises a Schottky diode.

6. An optical transmitter as claimed in claim 4, wherein the non-linear operating impedance of said diode corresponds to a substantially quadratic voltage vs current relationship.

* * * * *